(12) United States Patent
Thorup et al.

(10) Patent No.: US 7,713,822 B2
(45) Date of Patent: May 11, 2010

(54) METHOD OF FORMING HIGH DENSITY TRENCH FET WITH INTEGRATED SCHOTTKY DIODE

(75) Inventors: Paul Thorup, West Jordan, UT (US); Ashok Challa, Sandy, UT (US); Bruce Douglas Marchant, Murray, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/249,889

(22) Filed: Oct. 10, 2008

(65) Prior Publication Data

US 2009/0035900 A1 Feb. 5, 2009

Related U.S. Application Data

(63) Continuation of application No. 11/388,790, filed on Mar. 24, 2006, now Pat. No. 7,446,374.

(51) Int. Cl.
*H01L 29/76* (2006.01)
*H01L 29/94* (2006.01)

(52) U.S. Cl. .................. 438/270; 438/268; 438/273; 438/274; 257/328; 257/330; 257/E21.418; 257/E21.419

(58) Field of Classification Search ............... 438/268, 438/270, 273, 274; 257/328, 330, E21.418, 257/E21.419
See application file for complete search history.

(56) References Cited

U.S. PATENT DOCUMENTS 3,257,626 A 6/1966 Marinace et al.

(Continued)

FOREIGN PATENT DOCUMENTS

CN 1036666 10/1989

(Continued)

OTHER PUBLICATIONS

Bulucea "Trench DMOS Transistor Technology For High Current (100 A Range) Switching" Solid-State Electronics vol. 34 pp. 493-507 (1991).

(Continued)

*Primary Examiner*—Dao H Nguyen
(74) *Attorney, Agent, or Firm*—Townsend and Townsend and Crew LLP

(57) ABSTRACT

A method of forming a monolithically integrated trench FET and Schottky diode includes the following steps. Two trenches are formed extending through an upper silicon layer and terminating within a lower silicon layer. The upper and lower silicon layers have a first conductivity type. First and second silicon regions of a second conductivity type are formed in the upper silicon layer between the pair of trenches. A third silicon region of the first conductivity type is formed extending into the first and second silicon regions between the pair of trenches such that remaining lower portions of the first and second silicon regions form two body regions separated by a portion of the upper silicon layer. A silicon etch is performed to form a contact opening extending through the first silicon region such that outer portions of the first silicon region remain, the outer portions forming source regions. An interconnect layer is formed filling the contact opening so as to electrically contact the source regions and the portion of the upper silicon layer. The interconnect layer electrically contacts the second silicon region so as to form a Schottky contact therebetween.

19 Claims, 7 Drawing Sheets

U.S. PATENT DOCUMENTS

| | | |
|---|---|---|
| 3,404,295 A | 10/1968 | Warner et al. |
| 3,412,297 A | 11/1968 | Amlinger |
| 3,660,697 A | 5/1972 | Berglund et al. |
| 4,003,072 A | 1/1977 | Matsushita et al. |
| 4,300,150 A | 11/1981 | Colak |
| 4,324,038 A | 4/1982 | Chang et al. |
| 4,326,332 A | 4/1982 | Kenney et al. |
| 4,445,202 A | 4/1984 | Goetze et al. |
| 4,568,958 A | 2/1986 | Baliga |
| 4,579,621 A | 4/1986 | Hine |
| 4,636,281 A | 1/1987 | Buiguez et al. |
| 4,673,962 A | 6/1987 | Chatterjee et al. |
| 4,694,313 A | 9/1987 | Beasom |
| 4,716,126 A | 12/1987 | Cogan |
| 4,745,079 A | 5/1988 | Pfiester |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,811,065 A | 3/1989 | Cogan |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,903,189 A | 2/1990 | Ngo et al. |
| 4,914,058 A | 4/1990 | Blanchard |
| 4,956,308 A | 9/1990 | Griffin et al. |
| 4,967,245 A | 10/1990 | Cogan et al. |
| 4,974,059 A | 11/1990 | Kinzer |
| 4,982,260 A | 1/1991 | Chang et al. |
| 4,992,390 A | 2/1991 | Chang |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,126,807 A | 6/1992 | Baba et al. |
| 5,142,640 A | 8/1992 | Iwanatsu |
| 5,156,989 A | 10/1992 | Williams et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,242,845 A | 9/1993 | Baba et al. |
| 5,250,450 A | 10/1993 | Lee et al. |
| 5,270,257 A | 12/1993 | Shin |
| 5,283,201 A | 2/1994 | Tsang et al. |
| 5,283,452 A | 2/1994 | Shih et al. |
| 5,294,824 A | 3/1994 | Okada |
| 5,300,447 A | 4/1994 | Anderson |
| 5,346,834 A | 9/1994 | Hisamoto et al. |
| 5,349,224 A | 9/1994 | Gilbert et al. |
| 5,350,937 A | 9/1994 | Yamazaki et al. |
| 5,366,914 A | 11/1994 | Takahashi et al. |
| 5,378,655 A | 1/1995 | Hutchings et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,442,214 A | 8/1995 | Yang |
| 5,449,925 A | 9/1995 | Baliga et al. |
| 5,473,176 A | 12/1995 | Kakumoto |
| 5,474,943 A | 12/1995 | Hshieh et al. |
| 5,532,179 A | 7/1996 | Chang et al. |
| 5,541,425 A | 7/1996 | Nishihara |
| 5,554,552 A | 9/1996 | Chi et al. |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,581,100 A | 12/1996 | Ajit |
| 5,583,060 A | 12/1996 | Hertrich et al. |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,614,751 A | 3/1997 | Yilmaz et al. |
| 5,616,945 A | 4/1997 | Williams |
| 5,629,543 A | 5/1997 | Hshieh et al. |
| 5,635,419 A | 6/1997 | Geiss et al. |
| 5,637,898 A | 6/1997 | Baliga |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,714,781 A | 2/1998 | Yamamoto et al. |
| 5,744,372 A | 4/1998 | Bulucea |
| 5,767,004 A | 6/1998 | Balasubramanian et al. |
| 5,770,878 A | 6/1998 | Beasom |
| 5,780,343 A | 7/1998 | Bashir |
| 5,801,417 A | 9/1998 | Tsang et al. |
| 5,818,084 A | 10/1998 | Williams et al. |
| 5,821,583 A | 10/1998 | Hshieh et al. |
| 5,877,528 A | 3/1999 | So |
| 5,891,776 A | 4/1999 | Han et al. |
| 5,894,157 A | 4/1999 | Han et al. |
| 5,895,951 A * | 4/1999 | So et al. .................... 257/330 |
| 5,895,952 A | 4/1999 | Darwish et al. |
| 5,897,343 A | 4/1999 | Mathew et al. |
| 5,897,360 A | 4/1999 | Kawaguchi |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |
| 5,945,708 A | 8/1999 | Tihanyi |
| 5,949,104 A | 9/1999 | D'Anna et al. |
| 5,949,124 A | 9/1999 | Hadizad et al. |
| 5,960,271 A | 9/1999 | Wollesen et al. |
| 5,960,311 A | 9/1999 | Singh et al. |
| 5,973,360 A | 10/1999 | Tihanyi |
| 5,977,591 A | 11/1999 | Fratin et al. |
| 5,981,344 A | 11/1999 | Hshieh et al. |
| 5,981,354 A | 11/1999 | Spikes et al. |
| 5,981,996 A | 11/1999 | Fujishima |
| 5,998,833 A | 12/1999 | Baliga |
| 6,008,097 A | 12/1999 | Yoon et al. |
| 6,008,520 A | 12/1999 | Darwish et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,632 A | 3/2000 | Omura et al. |
| 6,037,633 A | 3/2000 | Shinohara |
| 6,040,600 A | 3/2000 | Uenishi et al. |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,072,215 A | 6/2000 | Kawaji et al. |

| | | | | | | |
|---|---|---|---|---|---|---|
| 6,077,733 A | 6/2000 | Chen et al. | 6,436,779 B2 | 8/2002 | Hurkx et al. | |
| 6,081,009 A | 6/2000 | Neilson | 6,437,386 B1 | 8/2002 | Hurst et al. | |
| 6,084,264 A | 7/2000 | Darwish | 6,444,527 B1 | 9/2002 | Floyd et al. | |
| 6,084,268 A | 7/2000 | de Fresart et al. | 6,459,122 B2 | 10/2002 | Uno | |
| 6,087,232 A | 7/2000 | Kim et al. | 6,461,918 B1 | 10/2002 | Calafut | |
| 6,096,608 A | 8/2000 | Williams | 6,465,304 B1 | 10/2002 | Blanchard | |
| 6,096,629 A | 8/2000 | Tsai et al. | 6,465,843 B1 | 10/2002 | Hirler et al. | |
| 6,103,619 A | 8/2000 | Lai | 6,465,869 B2 | 10/2002 | Ahlers et al. | |
| 6,104,043 A | 8/2000 | Hermansson et al. | 6,472,678 B1 | 10/2002 | Hshieh et al. | |
| 6,104,054 A | 8/2000 | Corsi et al. | 6,472,708 B1 | 10/2002 | Hshieh et al. | |
| 6,114,727 A | 9/2000 | Ogura et al. | 6,475,884 B2 | 11/2002 | Hshieh et al. | |
| 6,140,678 A | 10/2000 | Grabowski et al. | 6,476,443 B1 | 11/2002 | Kinzer | |
| 6,150,697 A | 11/2000 | Teshigahara et al. | 6,479,352 B2 | 11/2002 | Blanchard | |
| 6,156,606 A | 12/2000 | Michaelis | 6,534,825 B2 | 3/2003 | Calafut | |
| 6,156,611 A | 12/2000 | Lan et al. | 6,566,804 B1 | 5/2003 | Trujillo et al. | |
| 6,163,052 A | 12/2000 | Liu et al. | 6,600,194 B1 | 7/2003 | Hueting | |
| 6,165,870 A | 12/2000 | Shim et al. | 6,608,350 B2 | 8/2003 | Kinzer et al. | |
| 6,168,983 B1 | 1/2001 | Rumennik et al. | 6,677,641 B2 | 1/2004 | Kocon | |
| 6,171,935 B1 | 1/2001 | Nance et al. | 6,677,643 B2 | 1/2004 | Iwamoto et al. | |
| 6,174,769 B1 | 1/2001 | Lou | 6,724,042 B2 | 4/2004 | Onishi et al. | |
| 6,174,785 B1 | 1/2001 | Parekh et al. | 6,861,723 B2 | 3/2005 | Willmeroth | |
| 6,184,092 B1 | 2/2001 | Tseng et al. | 6,875,671 B2 | 4/2005 | Faris | |
| 6,184,545 B1 | 2/2001 | Werner et al. | 6,897,133 B2 | 5/2005 | Collard | |
| 6,184,555 B1 | 2/2001 | Tihanyi et al. | 6,929,988 B2 | 8/2005 | Zeng | |
| 6,188,104 B1 | 2/2001 | Choi et al. | 6,991,977 B2 * | 1/2006 | Kocon | 438/206 |
| 6,188,105 B1 | 2/2001 | Kocon et al. | 2001/0000068 A1 | 3/2001 | Isogai et al. | |
| 6,191,447 B1 | 2/2001 | Baliga | 2001/0023961 A1 | 9/2001 | Hshieh et al. | |
| 6,194,741 B1 | 2/2001 | Kinzer et al. | 2001/0028083 A1 | 10/2001 | Onishi et al. | |
| 6,198,127 B1 | 3/2001 | Kocon | 2001/0032998 A1 | 10/2001 | Iwamoto et al. | |
| 6,201,279 B1 | 3/2001 | Pfirsch | 2001/0041400 A1 | 11/2001 | Ren et al. | |
| 6,207,994 B1 | 3/2001 | Rumennik et al. | 2001/0050394 A1 | 12/2001 | Onishi et al. | |
| 6,222,229 B1 | 4/2001 | Hebert et al. | 2002/0003266 A1 | 1/2002 | Manning | |
| 6,222,233 B1 | 4/2001 | D'Anna | 2002/0008284 A1 | 1/2002 | Zeng | |
| 6,229,194 B1 | 5/2001 | Lizotte | 2002/0009832 A1 | 1/2002 | Blanchard | |
| 6,246,090 B1 | 6/2001 | Brush et al. | 2002/0016062 A1 | 2/2002 | Uno | |
| 6,265,269 B1 | 7/2001 | Chen et al. | 2002/0038886 A1 | 4/2002 | Mo | |
| 6,271,082 B1 | 8/2001 | Hou et al. | 2002/0047175 A1 | 4/2002 | Tani et al. | |
| 6,271,100 B1 | 8/2001 | Ballantine et al. | 2002/0066924 A1 | 6/2002 | Blanchard | |
| 6,274,437 B1 | 8/2001 | Evans | 2002/0070418 A1 | 6/2002 | Kinzer et al. | |
| 6,274,904 B1 | 8/2001 | Tihanyi | 2002/0100933 A1 | 8/2002 | Marchant | |
| 6,277,706 B1 | 8/2001 | Ishikawa | 2002/0179980 A1 | 12/2002 | Yagishita et al. | |
| 6,281,547 B1 | 8/2001 | So et al. | 2003/0015756 A1 | 1/2003 | Farber et al. | |
| 6,285,060 B1 | 9/2001 | Korec et al. | 2003/0073287 A1 | 4/2003 | Kocon | |
| 6,291,298 B1 | 9/2001 | Williams et al. | 2003/0193067 A1 | 10/2003 | Kim | |
| 6,291,856 B1 | 9/2001 | Miyasaka et al. | 2005/0048701 A1 | 3/2005 | Minato et al. | |
| 6,294,818 B1 | 9/2001 | Fujihira | 2005/0161735 A1 | 7/2005 | Aoki et al. | |
| 6,297,534 B1 | 10/2001 | Kawaguchi et al. | 2005/0167695 A1 | 8/2005 | Yilmaz | |
| 6,303,969 B1 | 10/2001 | Tan | 2005/0167742 A1 | 8/2005 | Challa et al. | |
| 6,307,246 B1 | 10/2001 | Nitta et al. | 2005/0173758 A1 | 8/2005 | Peake et al. | |
| 6,316,280 B1 | 11/2001 | Fujiwara | 2005/0199918 A1 | 9/2005 | Calafut et al. | |
| 6,316,806 B1 | 11/2001 | Mo | 2005/0285238 A1 | 12/2005 | Joshi et al. | |
| 6,326,656 B1 | 12/2001 | Tihanyi | 2007/0235886 A1 | 10/2007 | Yilmaz et al. | |
| 6,337,499 B1 | 1/2002 | Werner | | | | |
| 6,346,464 B1 | 2/2002 | Takeda et al. | FOREIGN PATENT DOCUMENTS | | | |
| 6,346,469 B1 | 2/2002 | Greer | DE | 4300806 | 12/1993 | |
| 6,353,252 B1 | 3/2002 | Yasuhara et al. | DE | 19736981 | 8/1998 | |
| 6,355,501 B1 | 3/2002 | Fung et al. | DE | 102414160 | 10/2003 | |
| 6,359,308 B1 | 3/2002 | Hijzen et al. | DE | 102004057235 | 6/2006 | |
| 6,362,112 B1 | 3/2002 | Hamerski | EP | 288739 | 11/1988 | |
| 6,362,505 B1 | 3/2002 | Tihanyi | EP | 292782 | 11/1988 | |
| 6,365,462 B2 | 4/2002 | Baliga | EP | 345380 | 12/1989 | |
| 6,365,930 B1 | 4/2002 | Schillaci et al. | EP | 975024 | 1/2000 | |
| 6,373,098 B1 | 4/2002 | Brush et al. | EP | 1054451 | 11/2000 | |
| 6,376,314 B1 | 4/2002 | Jerred | EP | 1170803 | 1/2002 | |
| 6,376,315 B1 | 4/2002 | Hshieh et al. | EP | 1205980 | 5/2002 | |
| 6,376,878 B1 | 4/2002 | Kocon | JP | 56-058267 | 5/1981 | |
| 6,384,456 B1 | 5/2002 | Tihanyi | JP | 62-069562 | 3/1987 | |
| 6,384,955 B2 | 5/2002 | Tada et al. | JP | 63-288047 | 11/1988 | |
| 6,392,290 B1 | 5/2002 | Kasem et al. | JP | 2000-040872 | 2/2000 | |
| 6,420,770 B1 | 7/2002 | Xiang et al. | JP | 2000-156978 | 6/2000 | |
| 6,426,260 B1 | 7/2002 | Hshieh | JP | 2000-277726 | 10/2000 | |
| 6,429,481 B1 | 8/2002 | Mo et al. | JP | 2000-277728 | 10/2000 | |
| 6,433,385 B1 | 8/2002 | Kocon et al. | | | | |

| | | |
|---|---|---|
| JP | 2001-015448 | 1/2001 |
| JP | 2001-015752 | 1/2001 |
| JP | 2001-102577 | 4/2001 |
| JP | 2001-111041 | 4/2001 |
| JP | 2001-135819 | 5/2001 |
| JP | 2001-144292 | 5/2001 |
| JP | 2001-192174 | 7/2001 |
| JP | 2001-244461 | 9/2001 |
| JP | 2001-313391 | 11/2001 |
| JP | 2002-040822 | 2/2002 |
| JP | 2005-226638 | 8/2005 |
| WO | 00/33386 | 6/2000 |
| WO | 00/68997 | 11/2000 |
| WO | 00/68998 | 11/2000 |
| WO | 00/75965 | 12/2000 |
| WO | 0106550 | 1/2001 |
| WO | 0106557 | 1/2001 |
| WO | 01/45155 | 6/2001 |
| WO | 01/59847 | 8/2001 |
| WO | 01/71815 | 9/2001 |
| WO | 01/95385 | 12/2001 |
| WO | 01/95398 | 12/2001 |
| WO | 0201644 | 1/2002 |
| WO | 02/47171 | 6/2002 |
| WO | 2005091799 | 10/2005 |
| WO | 2006108011 | 10/2006 |
| WO | 2006127914 | 11/2006 |
| WO | 2007112187 | 10/2007 |

OTHER PUBLICATIONS

PCT Written Opinion of The International Searching Authority for Application No. PCT/US2006-061423, Dated Nov. 29, 2008.
"CoolMOS the second generation," Infineon Technologies Product Information, 2 pages total, (2000).
Bai et al. "Novel Automated Optimization of Power MOSFET for 12V Input, High-Frequency DC-DC Converter," International Symposium on Power Semiconductors and Ics, Technical Digest, (2003), pp. 366-369.
Baliga "Options for CVD of Dielectrics Include Low-k Materials." Technical Literature from Semiconductor International 4 pages total, Jun. 1998.
Baliga et al. "Improving The Reverse Recovery of Power MOSFET Integral Diodes by Electron Irradiation," Solid State Electronics, vol. 26, No. 12, pp. 1133-1141, Dec. 1983.
Brown et al. Novel Trench Gate Structure Developments Set the Benchmark for Next Generation Power MOSFET Switching Performance. Power Electronics—Proceedings (PCIM), Nurenburg, Vo.47. pp. 275-278, May 2003.
Kao et al. "Two Dimensional Thermal Oxidation of Silicon-II Modeling Stress Effects in Wet Oxides." IEEE Transactions on Electron Devices, vol. ED-35 No. 1, pp. 25-37, Jan. 1988.
Moghadam "Delivering Value Around New Industry Paradigms," Technical Literature From Applied Materials, vol. 1, Issue 2, pp. 1-11, Nov. 1999.
Park et al. "Lateral Trench Gate Super-Junction SOI-LDMOSFETs With Low On-Resistance," Institute for Microelectronics, University of Technology Vienna, Austria, pp. 283-285, (2002).
Shenai et al. "Monolithically Integrated Power MOSFET and Schottky Diodes with Improved Reverse Recovery Characteristics," IEEE Transactions on Electron Devices, vol. 37, No. 4, pp. 1167-1169, (Apr. 1990).
Shenoy et al. "Analysis of the Effect of Change Imbalance on the Static and Dynamic Characteristic of the Super Junction MOSFET," IEEE International Symposium on Power Semiconductor Devices 1999, pp. 99-102 (1999).
Singer "Empty Spaces in Silicon (ESS): An Alternative to SOI," Semiconductor International p. 42, Dec. 1999.
Tabisz et al. "A MOSFET Resonant Synchronous Rectifier For High-Frequency DC/DC Converters," Proc. IEEE Power Electronics Specialist Conf. (PESC), pp. 769-779, (1990).

Technical Literature From Quester Technology, Model APT-4300 300mm Atmospheric TEOS/Ozone CVD System, 3 pages total, (unknown date).
Technical Literature From Quester Technology, Model APT-6000 Atmospheric TEOS/Ozone CVD System, 2 pages total (unknown date).
Technical Literature From Silicon Valley Group Thermal Systems, APNext, High Throughput APCVD Cluster Tool for 200mm/300mm Wafer Processing, 2 pages total (unknown date).
Tu et al. "On the Reverse Blocking Characteristics of Schottky Power Diodes," IEEE Transactions on Electron Devices, vol. 39, No. 12, pp. 2813-2814, (Dec. 1992).
Ueda et al. "An Ultra-Low On-Resistance Power MOSFET Fabricated by Using a Fully Self-Aligned Process," IEEE Transactions on Electron Devices 34:926-930 (1987).
Wilamowski "Schottky Diodes with High Breakdown Voltages," Solid-State Electronics 26:491-493 (1983).
Yamashita et al. Conduction Power Loss in MOSFET Synchronous Rectifier With Parallel-Connected Schottky Barrier Diode, IEEE Transactions on Power Electronics, vol. 13, No. 4, pp. 667-673, (Jul. 1998).
Mehrotra, M. et al. "Very Low Forward Drop JBS Rectifiers Fabricated Using Submicron Technology," Transactions on Electron Devices, vol. 40, No. 11, pp. 2131-2132, (Nov. 1993).
Wolf "Silicon Processing for the VLSI Era" vol. 1 Process Technology, Second Edition, pp. 658, (1990).
"IR develops CoolMOS—Equivalent Technology, Positions it at the top of a 3-Tiered Line of New Products for SMPS," International Rectifiers Company Information Available at http://www.irf.com, 3 pages total, (1999).
Baliga "New Concepts in Power Rectifiers." Physics of Semiconductor Devices, Proceedings of the Third Int'l Workshop, Madras (India). Committee on Science and Technology in Developing Countries, pp. 471-481(1985).
Chang et al. Numerical and Experimental Analysis of 500-V Power DMOSFET with an Atomic-Lattice Layout IEEE Transactions on Electron Devices 36:2623 (1989).
Chang et al. "Self-Aligned UMOSFET's with a Specific On-Resistance of 1mQ cm2," IEEE Transactions on Electron Devices 34:2329-2334(1987).
Cheng et al. "Fast Reverse Recovery Body Diode in High-Voltage VDMOSFET Using Cell-Distributed Schottky Contacts," IEEE Transactions on Electron Devices, vol. 50, No. 5, pp. 1422-1425, May 2003.
Curtis et al. "APCVD TEOS: 03 Advanced Trench Isolation Applications," Semiconductor Fabtech 9th Edition, 8 pages total, (1999).
Darwish et al. "A New Power W-Gated Trench MOSFET (WMOSFET) with High Switching Performance." ISPSD Proceedings—Cambridge, 4 pages total, Apr. 2003.
Djekic, O et al. "High Frequency Synchronous Buck Converter For Low Voltage Applications," Proc. IEEE Power Electronics Specialist Conf. (PESC), pp. 1248-1254, (1998).
Fujihira "Theory of Semiconductor Super Junction Devices," Jpn. J. Appl. Phys. vol. 36 pp. 6254-6262 (1997).
Gan et al. "Poly Flanked VDMOS (PFVDMOS): A Superior Technology for Super Junction Devices." IEEE Power Electronics Specialists Conf., Jun. 17-22, 2001, Vancouver, Canada, 4 pages total, (2001).
Glenn et al. "A Novel Vertical Deep Trench Resurf DMOS (VTR-DMOS)" IEEE ISPD, pp. 197-200, Toulouse France, May 22-25, 2000.
Kao et al. "Two Dimensional Thermal Oxidation of Silicon-1. Experiments." IEEE Transactions on Electron Devices, vol. ED-34 No. 5, pp. 1008-1017, May 1987.
Kassakian, J.G. et al. "High-Frequency High-Density Converters For Distributed Power Supply Systems," Proc. of the IEEE, vol. 76, No. 4, pp. 362-376, (Apr. 1988).
Korman, C.S. et al. "High Performance Power DMOSFET With Integrated Schottky Diode," Proc. Idée Power Electronics Specialist Conf. (PESC), pp. 176-179, (1989).
Lorenz et al. "COOL MOS—An Important Milestone Towards a New Power MOSFET Generation" Power Conversion pp. 151-160 (1988).

Maksimovic, A.M. et al. "Modeling and Simulation of Power Electronic Converters," Proc. Of the IEEE, vol. 89, No. 6, pp. 898-912, (Jun. 2001).

Sakai et al. "Experimental Investigation of Dependence of Electrical Characteristics of Device Parameters in Trench MOS Barrier, Schottky Diodes," International Symposium on Power Semiconductors and ICs, Technical Digest, pp. 293-296, (1998).

Shenai et al. "Current Transport Mechanisms in Automatically Abrupt Metal-Semiconductor Interfaces," IEEE Transactions on Electron Devices, vol. 35, No. 4, pp. 468-482, (Apr. 1988).

Mahalingam et al."A Low Forward Drop High Voltage Trench MOS Barrier Schottky Rectifier With Linearly Graded Doping Profile," PRSC Document TR-97-030, Power Semiconductor Research Center, North Carolina State University, 1997.

PCT International Preliminary Report on Patentability For Application No. PCT/US2006/012581 Dated Oct. 9, 2007.

PCT International Preliminary Report on Patentability For Application No. PCT/US2005/004122 Dated Oct. 4, 2006.

PCT, International Search Report of The International Searching Authority for Application No. PCT/US2000/03664 Sep. 11, 2000.

PCT, International Search Report of The International Searching Authority for Application No. PCT/US2006/12581 Feb. 6, 2007.

PCT, International Search Report of The International Searching Authority for Application No. PCT/US2005/04122 Aug. 7, 2006.

Office Action in U.S. Appl. No. 10/801,499 Dated Oct. 20, 2005.
Office Action in U.S. Appl. No. 10/801,499 Dated May 15, 2006.
Office Action in U.S. Appl. No. 10/801,499 Dated Nov. 3, 2006.
Office Action in U.S. Appl. No. 10/801,499 Dated Aug. 31, 2007.
Office Action in U.S. Appl. No. 09/267,921 Dated Mar. 12, 2001.
Office Action in U.S. Appl. No. 09/267,921 Dated Sep. 26, 2000.

Mahalingam et al."The Graded Doped power UMOSFET," Power Semiconductor Research Center Annual Report, pp. 68-71, North Carolina State University, 1968.

Tu et al. "Controlling the Charateristics of the MPS Rectifier by Variation of Area of Schottky Region," IEEE Transactions on Electron Devices, vol. 40, Issue: 7. pp. 1307-1315, Jul. 7, 1993.

PCT Written Opinion of The International Searching Authority for Application No. PCT/US2006/012581 Dated Feb. 6, 2007.

PCT Written Opinion of The International Searching Authority for Application No. PCT/US2005-04122 Dated Aug. 7, 2006.

PCT, International Search Report of The International Searching Authority for Application No. pct/us2007-063612 Dated Feb. 15, 2008.

PCT Written Opinion of The International Searching Authority for Application No. PCT/US2007-063612 Dated Feb. 15, 2008.

* cited by examiner

METHOD OF FORMING HIGH DENSITY TRENCH FET WITH INTEGRATED SCHOTTKY DIODE

CROSS-REFERENCES TO RELATED APPLICATIONS

This application is a continuation of U.S. application Ser. No. 11/388,790, filed Mar. 24, 2006, which disclosure is incorporated herein by reference in its entirety for all purposes.

BACKGROUND OF THE INVENTION

The present invention relates in general to semiconductor power device technology, and in particular to structures and methods for forming a monolithically integrated trench gate field effect transistor (FET) and Schottky diode.

In today's electronic devices it is common to find the use of multiple power supply ranges. For example, in some applications, central processing units are designed to operate with a different supply voltage at a particular time depending on the computing load. Consequently, dc/dc converters have proliferated in electronics to satisfy the wide ranging power supply needs of the circuitry. Common dc/dc converters utilize high efficiency switches typically implemented by power MOSFETs. The power switch is controlled to deliver regulated quanta of energy to the load using, for example, a pulse width modulated (PWM) methodology.

FIG. 1 shows a circuit schematic for a conventional dc/dc converter. A PWM controller 100 drives the gate terminals of a pair of power MOSFETs Q1 and Q2 to regulate the delivery of charge to the load. MOSFET switch Q2 is used in the circuit as a synchronous rectifier. In order to avoid shoot-through current, both switches must be off simultaneously before one of them is turned on. During this "dead time," the internal diode of each MOSFET switch, commonly referred to as body diode, can conduct current. Unfortunately the body diode has relatively high forward voltage and energy is wasted. To improve the conversion efficiency of the circuit, a Schottky diode 102 is often externally added in parallel with the MOSFET (Q2) body diode. Because a Schottky diode has lower forward voltage than the body diode, Schottky diode 102 effectively replaces the MOSFET body diode. The lower forward voltage of the Schottky diode results in improved power consumption.

For many years, the Schottky diode was implemented external to the MOSFET switch package. More recently, some manufacturers have introduced products in which discrete Schottky diodes are co-packaged with discrete power MOSFET devices. There have also been monolithic implementations of power MOSFETs with Schottky diode. An example of a conventional monolithically integrated trench MOSFET and Schottky diode is shown in FIG. 2. A Schottky diode 210 is formed between two trenches 200-3 and 200-4 surrounded by trench MOSFET cells on either side. N-type substrate 202 forms the cathode terminal of Schottky diode 210 as well as the drain terminal of the trench MOSFET. Conductive layer 218 provides the diode anode terminal and also serves as the source interconnect layer for MOSFET cells. The gate electrode in trenches 200-1, 200-2, 200-3, 200-4 and 200-5 are connected together in a third dimension and are therefore similarly driven. The trench MOSFET cells further include body regions 208 with source region 212 and heavy body regions 214 therein.

The Schottky diodes in FIG. 2 are interspersed between trench MOSFET cells. As a result, the Schottky diodes consume a significant portion of the active area, resulting in lower current ratings or a large die size. There is therefore a need for a monolithically and densely integrated Schottky diode and trench gate FET with superior performance characteristics.

BRIEF SUMMARY OF THE INVENTION

In accordance with another embodiment of the invention, a method of forming a monolithically integrated trench FET and Schottky diode includes the following steps. Two trenches are formed extending through an upper silicon layer and terminating within a lower silicon layer. The upper and lower silicon layers have a first conductivity type. First and second silicon regions of a second conductivity type are formed in the upper silicon layer between the pair of trenches. A third silicon region of the first conductivity type is formed extending into the first and second silicon regions between the pair of trenches such that remaining lower portions of the first and second silicon regions form two body regions separated by a portion of the upper silicon layer. A silicon etch is performed to form a contact opening extending through the first silicon region such that outer portions of the first silicon region remain, the outer portions forming source regions. An interconnect layer is formed filling the contact opening so as to electrically contact the source regions and the portion of the upper silicon layer. The interconnect layer electrically contacts the second silicon region so as to form a Schottky contact therebetween.

In one embodiment, the lower silicon layer has a higher doping concentration that the upper silicon layer.

In another embodiment, the electrical contact between the interconnect layer and the portion of the upper silicon layer is made at a depth below the source regions.

In another embodiment, each of the first and second regions has a substantially uniform doping concentration.

In another embodiment, a heavy body region of the second conductivity type is formed between the pair of trenches. The heavy body region extends into the two body regions and into the portion of the upper silicon layer.

In yet another embodiment, the two body regions, the source regions, and the heavy body region are self-aligned to the pair of trenches.

A further understanding of the nature and the advantages of the invention disclosed herein may be realized by reference to the remaining portions of the specification and the attached drawings.

DETAILED DESCRIPTION OF THE INVENTION

In accordance with embodiments of the invention, a Schottky diode is optimally integrated with a trench MOSFET in a single cell repeated many times in an array of such cells. Minimal to no active area is sacrificed in integrating the Schottky diode, yet the total Schottky diode area is large enough to handle 100% of the diode forward conduction. The MOSFET body diode thus never turns on, eliminating reverse recovery losses. Further, because of Schottky diode's lower forward voltage drop compared to that of the MOSFET body diode, power losses are reduced.

Moreover, the Schottky diode is integrated with the MOSFET such that the Schottky contact is formed below the MOSFET source regions. This advantageously diverts the avalanche current away from the source regions toward the Schottky regions, preventing the parasitic bipolar transistor from turning on. The device ruggedness is thus improved. This feature of the invention also eliminates, for the most part, the need for heavy body regions typically required in each MOSFET cell of prior art structures to prevent the parasitic bipolar transistor from turning on. Instead, islands of heavy body regions are incorporated intermittently and far apart from one another merely to ensure good source metal to body region contact. In essence, the heavy body regions required in prior art trench MOSFETs are, for the most part, replaced with Schottky diode. Accordingly, no additional silicon area is allocated to the Schottky diode.

Figure 3:
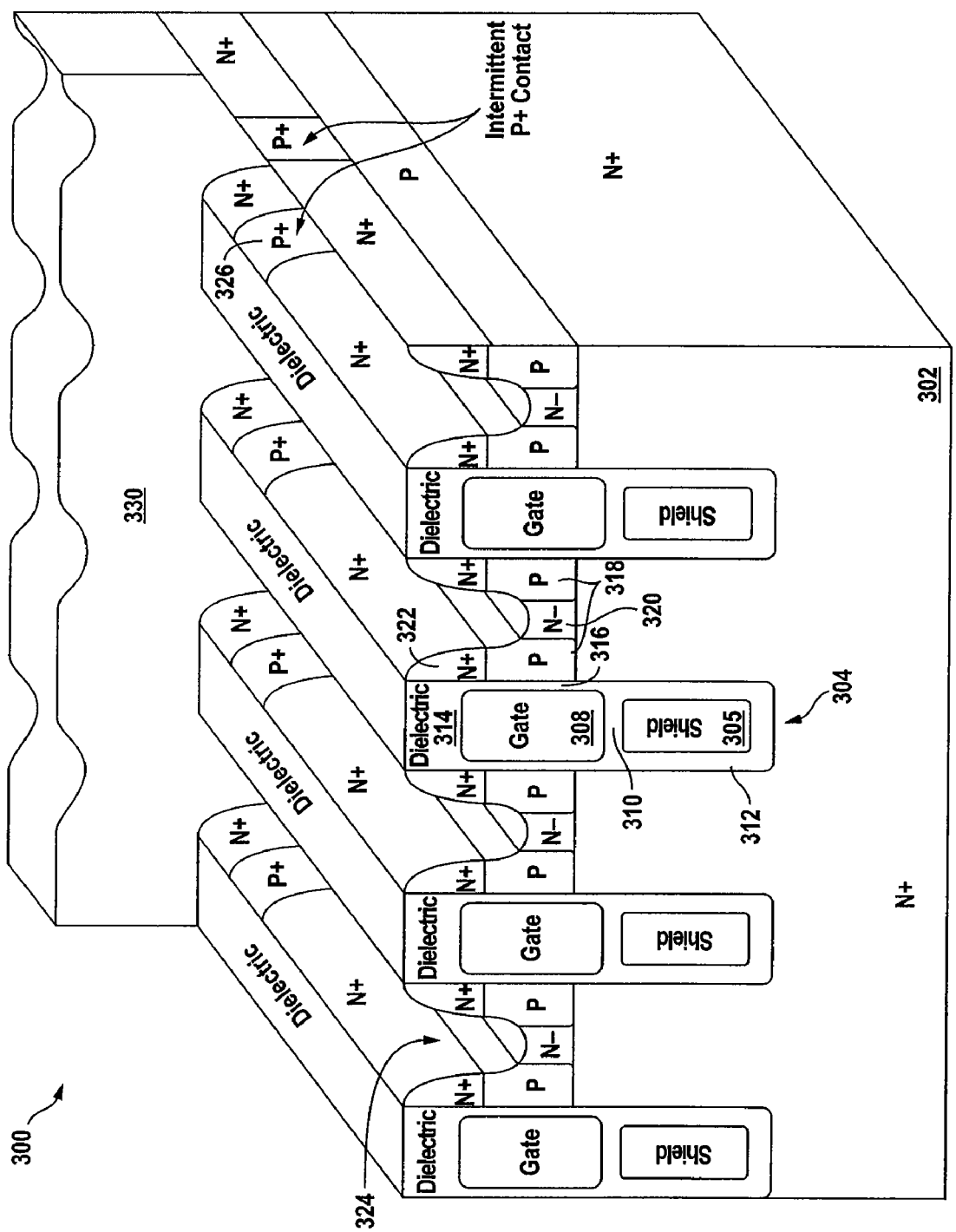
FIG. 3 is an exemplary simplified isometric view of a portion of an array of stripe-shaped cells each having a trench MOSFET and a Schottky diode integrated therein, in accordance with an embodiment of the invention.

FIG. 3 is an exemplary simplified isometric view of a portion of an array of stripe-shaped cells each having a trench MOSFET and a Schottky diode integrated therein, in accordance with an embodiment of the invention. A highly doped N-type (N+) region 302 overlies an N-type silicon substrate (not shown) which has an even higher doping concentration (N++) than N+ region 302. A plurality of trenches 304 extend to a predetermined depth within N+ region 302. A shield electrode 305 and an overlying gate electrode 308 are embedded in each trench 304. In one embodiment, shield electrodes 305 and gate electrodes 308 comprise polysilicon. An interelectrode dielectric 310 insulates the gate and shield electrodes from one another. Shield dielectric layer 312 lines lower sidewalls and bottom of each trench 304, and insulates shield electrodes 305 from surrounding N+ region 302. A gate dielectric 316, which is thinner than shield dielectric 312, lines the upper sidewalls of trenches 304. A dielectric cap 314 extends over each gate electrode 308. In one embodiment, shield electrodes 305 are electrically connected to source regions along a third dimension, and thus are biased to the same potential as the source regions during operation. In other embodiments, shield electrodes 305 are electrically tied to gate electrodes 308 along a third dimension, or are allowed to float.

Two P-type body regions 318 separated by a lightly doped N-type (N-) region 320 are located between every two adjacent trenches 304. Each body region 318 extends along one trench sidewall. In the various embodiments shown in the figures and described herein, body regions 318 and N- region 320 have substantially the same depth, however body regions 318 may be slightly shallower or deeper than N- region 320 and vice versa without any significant impact on the device operation. A highly doped N-type source region 322 is located directly above each body region 318. Source regions 322 vertically overlap gate electrode 308, and possess a rounded outer profile due to the presence of dimples 324 forming contact openings. Each dimple 324 extends below corresponding source regions 322 between every two adjacent trenches. As shown, source regions 322 and body regions 318 together form the rounded sidewalls of dimples 324, and N- regions 320 extend along the bottom of dimples 324. In one embodiment, N+ region 302 is an N+ epitaxial layer, and N- regions 320 are portions of an N- epitaxial layer in which body regions 318 and source regions 322 are formed. When MOSFET 300 is turned on, a vertical channel is formed in each body region 318 between each source region 322 and the highly doped region 302 along trench sidewalls.

A Schottky barrier metal 330, which is peeled back in FIG. 3 to expose the underlying regions, fills dimples 324 and extends over dielectric caps 314. Schottky barrier metal 330 electrically contacts N- regions 320 along the bottom of dimples 324, thus forming a Schottky contact. Schottky barrier metal 330 also serves as the top-side source interconnect, electrically contacting source regions 322 and heavy body regions 326.

During reverse bias, the depletion regions formed at each body/N- junction advantageously merge in N- region 320 thus fully depleting N- region 320 beneath the Schottky contact. This eliminates the Schottky leakage current which in turn allows the use of barrier metals with lower work functions. An even lower forward voltage is thus obtained for the Schottky diode.

Figure 4:
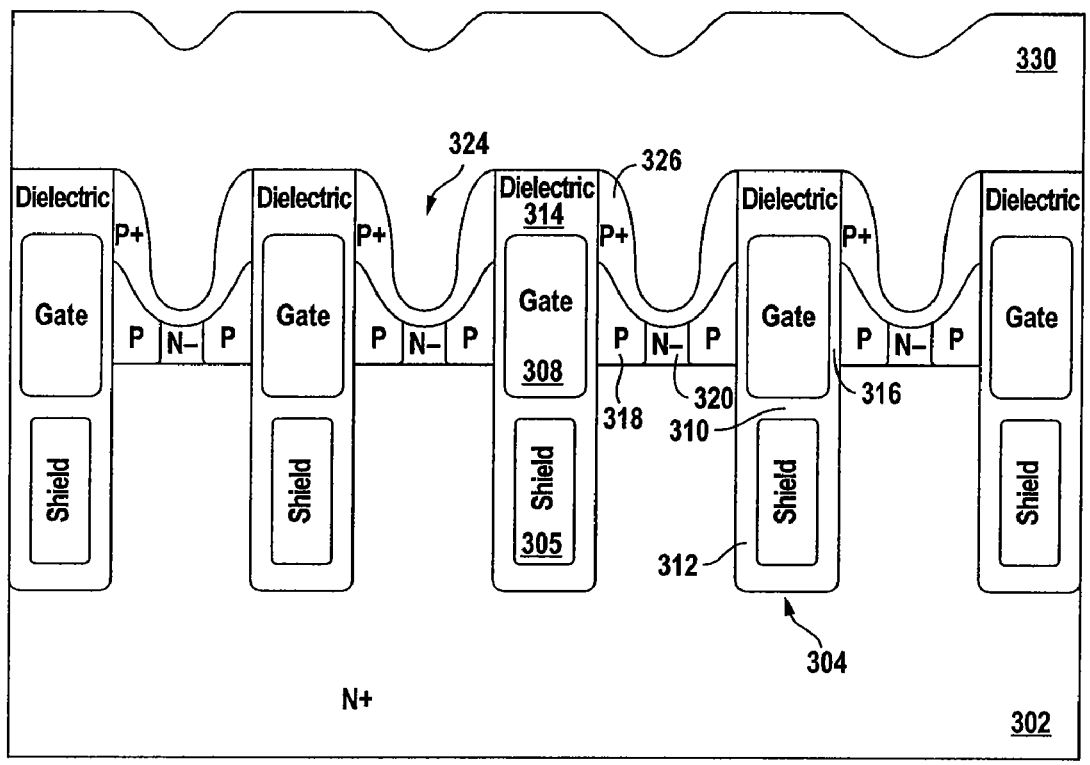
FIG. 4 shows a cross-section view along heavy body regions 326 in FIG. 3.

Islands of heavy body regions 326 are formed intermittently along the cell stripes, as shown. Heavy body regions 326 extend through N- regions 320. This is more clearly shown in FIG. 4 which is a cross-section view through heavy body regions 326 of the structure in FIG. 3. The cross section view in FIG. 4 is, for the most part, similar to the cross section view along the face of the isometric view in FIG. 3 except that in FIG. 4 the two source regions between every two adjacent trenches are replaced with one contiguous heavy body region 326 extending through N- regions 320. Heavy body regions 326 provide ohmic contact between source metal 330 and body regions 318. Because heavy body regions 326 extend through N- regions 320, no Schottky diode is formed in these regions. No MOSFET current flows in these regions either, because of the absence of source regions.

Figure 5:
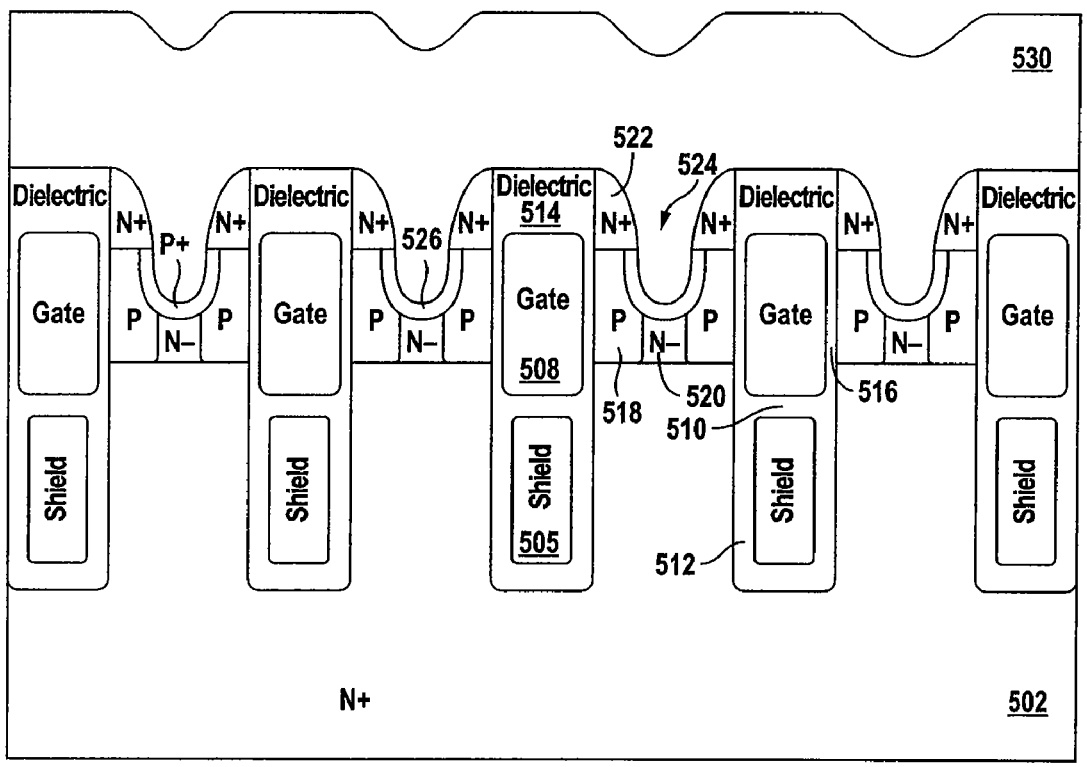
FIG. 5 is a simplified cross section view showing an alternate implementation of the heavy body region to that shown in FIGS. 3 and 4, in accordance with an embodiment of the invention.

FIG. 5 is a simplified cross section view showing an alternate implementation of the heavy body region to that in FIGS. 3 and 4, in accordance with another embodiment of the invention. In FIG. 5, heavy body regions 526 extend only along a bottom portion of each dimple 524 such that source regions 522 are kept intact. Thus, MOSFET current does flow in these regions, but heavy body regions 526 prevent Schottky barrier metal 530 from contacting N- regions 310 and thus no Schottky diode is formed in these regions.

Figure 1:
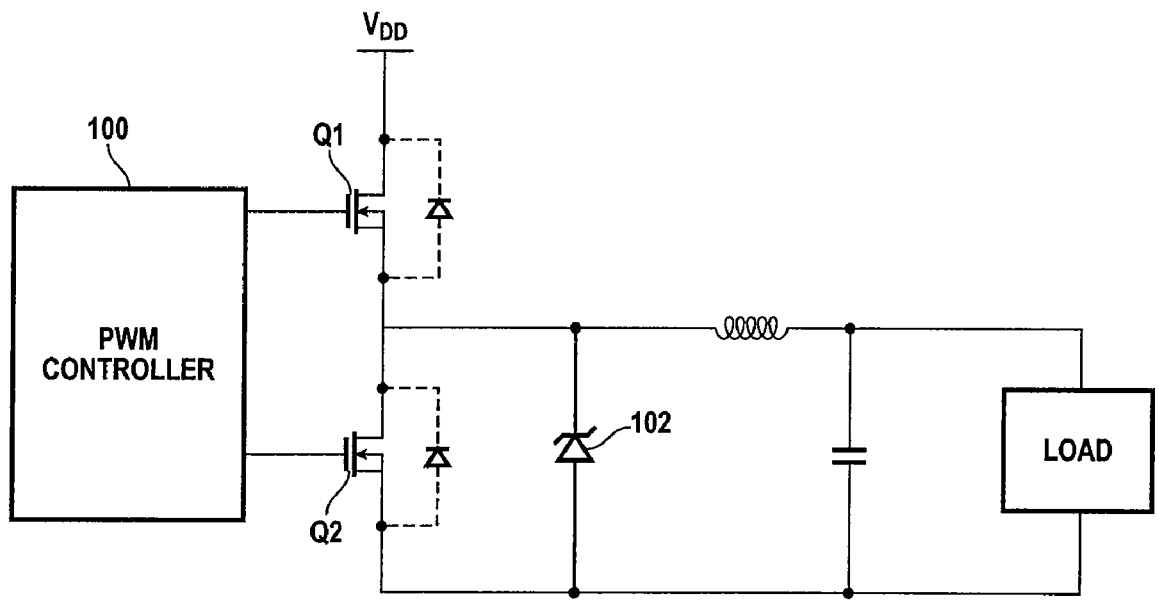
FIG. 1 is a circuit schematic for a conventional dc/dc converter using power MOSFETs with a Schottky diode.
Figure 2:
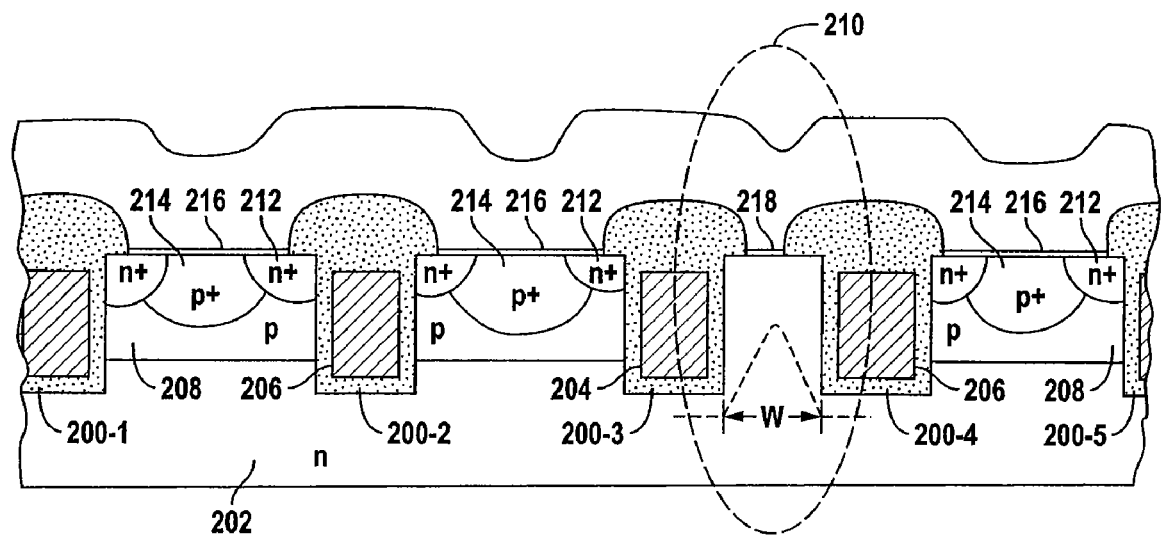
FIG. 2 shows a cross-sectional view of a conventional monolithically integrated trench MOSFET and Schottky diode.

Referring back to FIG. 3, the intermittent placing of heavy body regions 326 differs from conventional implementations where heavy body regions extend along the entire length of the cell stripes between two adjacent source regions as in the prior art FIG. 2 structure. Continuous heavy body regions are not needed in the FIG. 3 structure because of the manner in which the Schottky diode is integrated with the trench MOSFET. As can be seen in FIG. 3, by extending dimples 324 well below source regions 322, the Schottky contacts are similarly formed well below source regions 322. As described more fully in connection with FIGS. 7A-7C further below, with the Schottky contacts positioned well below source regions 322, the avalanche current is diverted away from source regions 322 toward the Schottky regions, thus preventing the parasitic bipolar transistor from turning on. This eliminates the need for continuous heavy body regions along the cell stripes typically required in prior art structures. Instead, islands of heavy body regions 326 are incorporated intermittently and far apart from one other along the cell stripes to ensure good source metal 330 to body region 318 contact. With the continuous heavy body regions replaced, for the most part, with Schottky regions, no additional silicon area needs to be allocated to the Schottky diode. Thus no silicon area is sacrificed in integrating the Schottky diode.

In some embodiments, the placement frequency of heavy body regions 326 along the stripes is dictated by the device switching requirements. For faster switching devices, heavy body regions are placed more frequently along the stripes. For these devices, additional silicon area may need to be allocated to Schottky diode (e.g., by increasing the cell pitch). For slower switching devices, fewer heavy body regions are required along the stripes. For these devices, placing a heavy body region at each end of a stripe may suffice, thus maximizing the Schottky diode area.

Figure 6A:
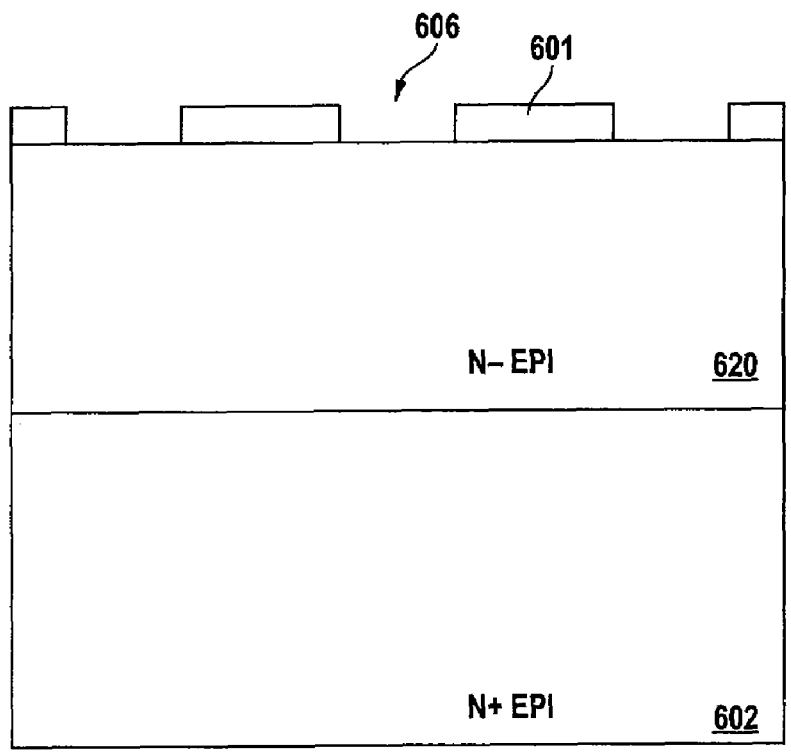
FIGS. 6A-6F are simplified cross section views illustrating an exemplary process sequence for forming the monolithically integrated trench MOSFET and Schottky diode shown in FIG. 3, according to an embodiment of the present invention.

FIGS. 6A-6F are simplified cross section views illustrating an exemplary process sequence for forming the integrated MOSFET-Schottky structure in FIG. 3, according to an embodiment of the present invention. In FIG. 6A, two epitaxial layers 602 and 620 overlying a silicon substrate (not shown) are formed using conventional techniques. Epitaxial layer 620 which is a lightly doped N-type layer (N−) extends over epitaxial layer 620 which is a highly doped N-type layer (N+). A hard mask (e.g., comprising oxide) is formed, patterned and etched to form hard mask islands 601 over N− epi 620. Surface areas of the N− epi 620 are thus exposed through openings 606 defined by hard mask islands 601. In one embodiment, openings 606, which define the trench width, are about 0.3 μm each, and the width of each hard mask island 601 is in the range of 0.4-0.8 μm. These dimensions define the cell pitch within which the MOSFET and Schottky diode are formed. Factors impacting these dimensions include the capabilities of the photolithographic equipment and the design and performance goals.

Figure 6B:
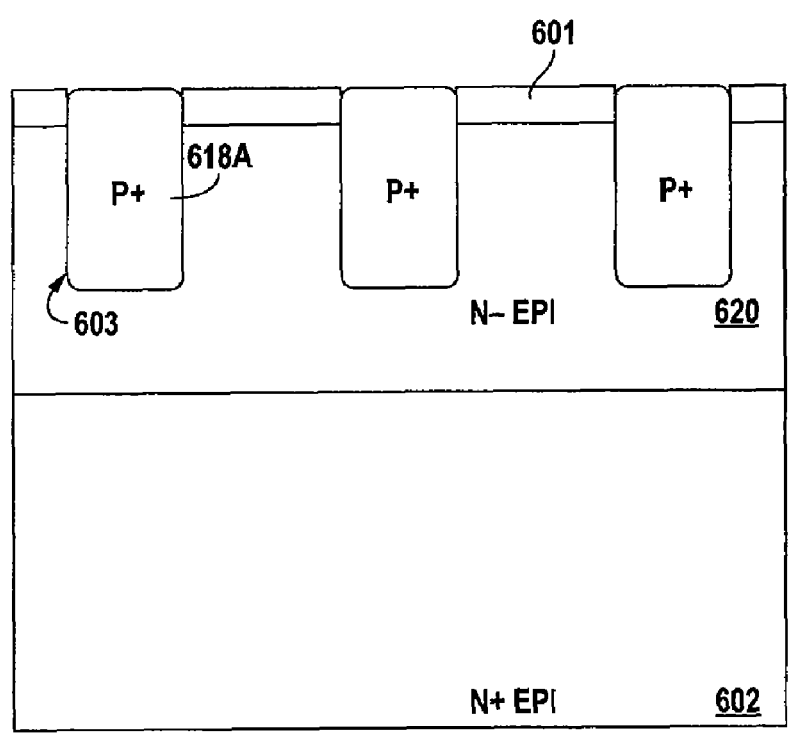

In FIG. 6B, trenches 603 terminating within N− epi 620 are formed by etching silicon through openings 606 using conventional silicon etch techniques. In one embodiment, trenches 603 have a depth of about 1 μm. A conventional selective epitaxial growth (SEG) process is then used to grow highly doped P-type (P+) silicon regions 618A within each trench 603. In one embodiment, P+ silicon region 618A has a doping concentration of about $5 \times 10^{17}$ cm$^{-3}$. In another embodiment, prior to forming P+ regions 618, a thin layer of high-quality silicon lining the sidewalls and bottom of trenches 608 is formed. The thin silicon layer serves as an undamaged silicon surface suitable for growth of the P+ silicon.

Figure 6C:
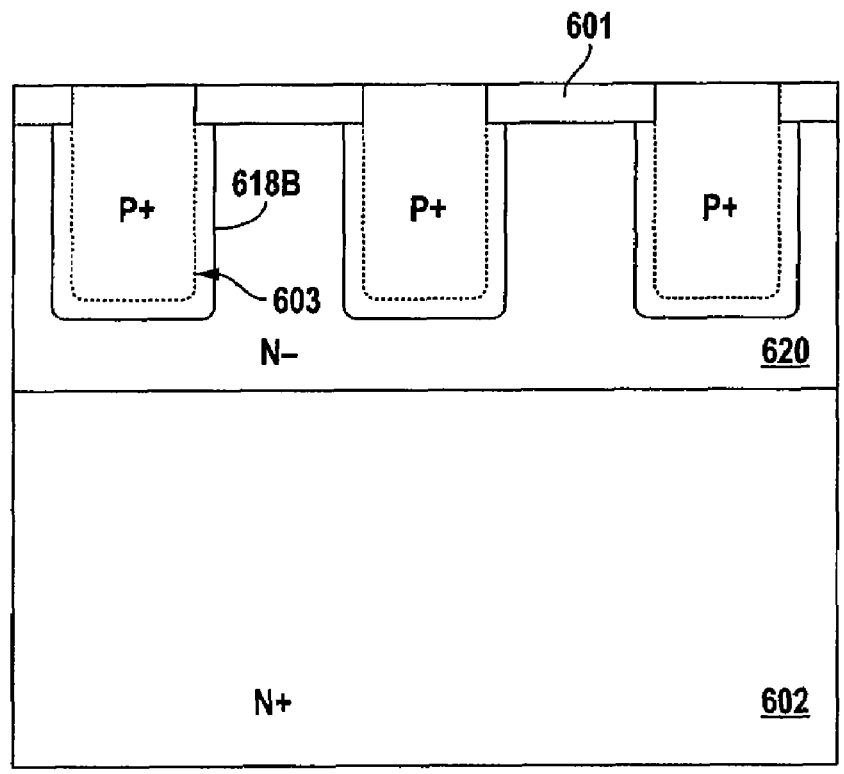

In FIG. 6C, a diffusion process is performed to diffuse the p-type dopants into P+ region 618A into N− epi 620. Out-diffused P+ regions 618B extending laterally under hard mask islands 601 and downward into N− epi 620 are thus formed. Multiple thermal cycles may be carried out to achieve the desired out-diffusion. The dotted lines in FIG. 6C show the outline of trenches 603. This diffusion process, as well as other thermal cycles in the process, causes N+ epi 602 to diffuse upward. These upward diffusions of N+epi 602 need to be accounted for in selecting the thickness of N− epi 620.

Figure 6D:
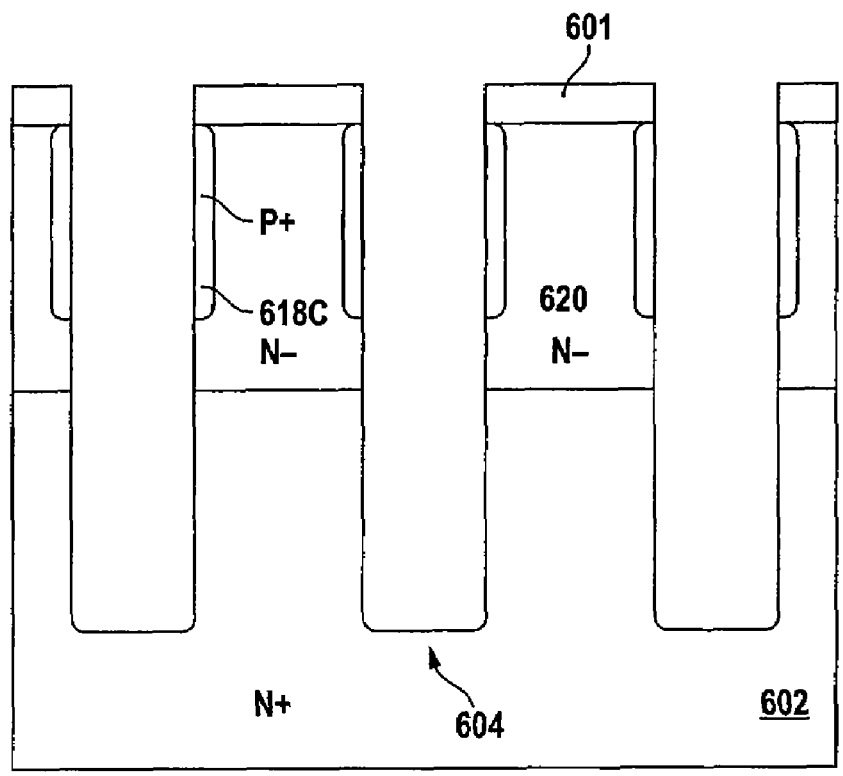

In FIG. 6D, using hard mask islands 601, a deep trench etch process is performed to form trenches 604 extending through P+ regions 618B and N− epi 620, terminating in N+epi 602. In one embodiment, trenches 604 have a depth of about 2 μm.

The trench etch process cuts through and removes a central portion of each P+ silicon region 618B, leaving vertically outer P+ strips 618C extending along trench sidewalls.

In another embodiment of the invention, P+ strips 618C are formed using a two-pass angled implant instead of the SEG technique depicted by FIGS. 6B-6D, as described next. In FIG. 6B, after forming trenches 603 through mask openings 606, P-type dopants such as boron are implanted into opposing trench sidewalls using conventional two-pass angled implant techniques. Hard mask islands 604 serve as blocking structures during the implantation process to prevent the implant ions from entering the mesa regions and to confine the location of the implanted ions to the desired regions in N− epi 620. To arrive at the structure shown in FIG. 6D, after the two pass angled implant, a second trench etch is carried out to extend the depth of trenches 603 into N+epi 602. In an alternate variation, only one trench etch (rather than two) is performed as follows. In FIG. 6B, using hard mask islands 601, a trench etch is carried out to form trenches extending into N+ epi 602 to about the same depth as trenches 604 in FIG. 6D. A two-pass angled implant is then carried out to implant P-type dopants into opposing trench sidewalls. The implant angle and the thickness of hard mask islands 601 are adjusted to define upper trench sidewall regions that are to receive the implant ions.

Figure 6E:
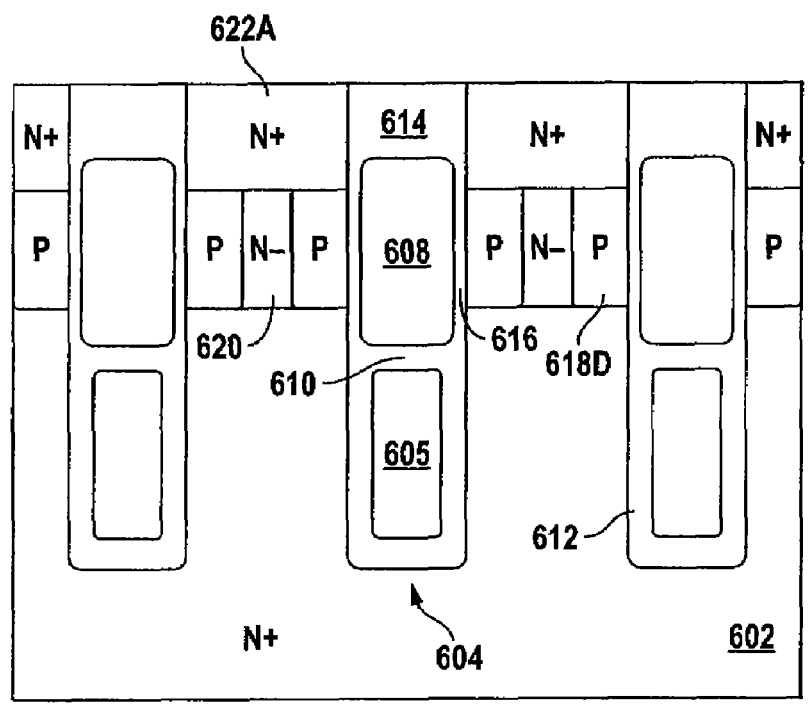

In FIG. 6E, a shielded gate structure is formed in trenches 604 using known techniques. A shield dielectric 612 lining lower sidewalls and bottom of trenches 604 is formed. Shield electrodes 605 are then formed filling a lower portion of trenches 604. An inter-electrode dielectric layer 610 is then formed over shield electrode 605. A gate dielectric 616 lining upper trench sidewalls is then formed. In one embodiment, gate dielectric 616 is formed in an earlier stage of the process. Recessed gate electrodes 608 are formed filling an upper portion of trenches 604. Dielectric cap regions 614 extend over gate electrodes 608 and fill the remainder of trenches 604.

Next, N-type dopants are implanted into all exposed silicon regions followed by a drive in process, thereby forming N+ regions 622A. No mask is used in the active region in forming N+ regions 622A. As shown in FIG. 6E, the various thermal cycles associated with forming the shielded gate structure and the N+ regions 622A cause P-type regions 618C to out-diffuse thereby forming wider and taller body regions 618D. As indicated earlier, these thermal cycles also cause N+epi 602 to diffuse upward as depicted in FIG. 6E. It is important to ensure that upon completion of the manufacturing process, the two body regions between every two adjacent trenches remain spaced apart and do not merge, otherwise the Schottky diode is eliminated. Another goal in designing the process is to ensure that N− epi 620 and body region 618D after completion of the process have substantially the same depth, although slightly different depths would not be fatal to the operation of the device. These goals can be achieved by adjusting a number of the process steps and parameters including the thermal cycles, the depth of the first trench recess (FIG. 6B), and doping concentration of various regions including the body regions, the N− epi region and the N+epi region.

Figure 6F:
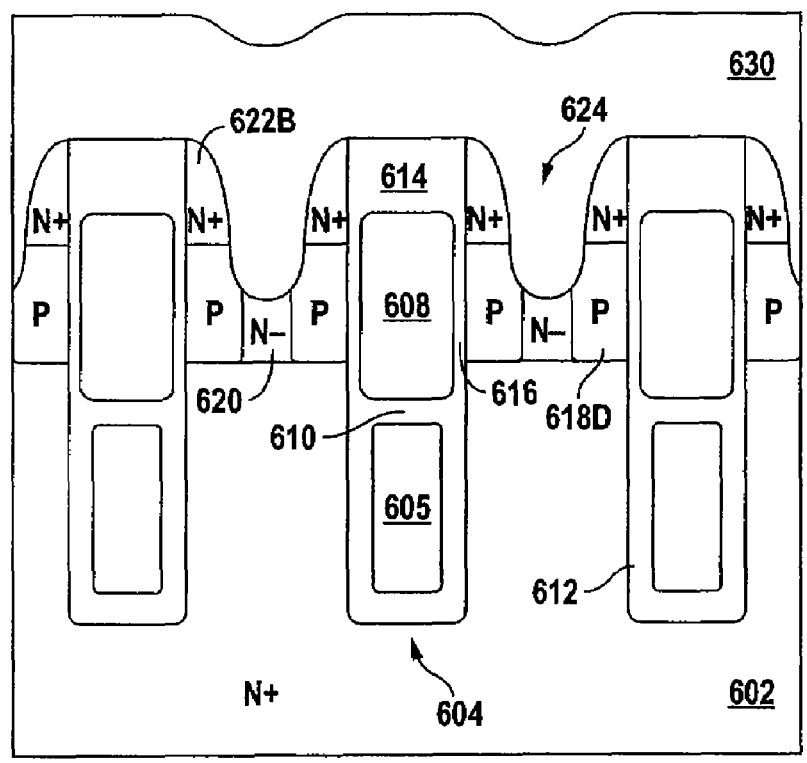

In FIG. 6F, without using a mask in the active region, a dimple etch process is performed to etch through N+ regions 622A such that outer portions 622B of N+ regions 622A are preserved. The preserved outer portions 622A form the source region. A dimple 624 is thus formed between every two adjacent trench. Dimples 624 form contact openings extending below source regions 622B and into N− regions 620. "Dimple etch" as used in this disclosure refers to silicon etch techniques which result in formation of silicon regions with sloped, rounded outer profiles as do source regions 622B in FIG. 6F. In one embodiment, the dimples extend to a depth within the bottom half of body regions 618D. As indicated before, a deeper dimple results in formation of a Schottky contact below the source regions. This helps divert reverse avalanche current away from the source, thus preventing the parasitic bipolar transistor from turning on. While the above dimple etch does not require a mask in the active region, in an alternate embodiment a mask is used to define a central portion of N+ regions 622A that is etched through to the desired depth. Outer portions of N+ regions 622A extending under such a mask are thus preserved. These outer regions form the source regions.

Using a masking layer, P-type dopants are implanted into the dimple region intermittently along each stripe. Islands of heavy body regions (not shown) are thus formed between every two adjacent trench. If the heavy body implementation of FIG. 4 is desired, a high enough dosage of P-type dopants need to be used during the heavy body implant in order to counter-dope those portions of the source regions where the heavy body regions are to be formed. If the heavy body implementation of FIG. 5 is desired, a lower dosage of P-type dopants needs to be used during the implant so that the source regions are not counter-doped and thus remain intact.

In FIG. 6F, conventional techniques can be used to form a Schottky barrier metal 630 over the structure. Schottky barrier metal 630 fills dimples 624, and where metal 630 comes in electrical contact with N− regions 620, a Schottky diode is formed. Metal layer 630 also contacts source regions 622B and the heavy body regions.

In the process sequence depicted by FIGS. 6A-6F, neither of the two masks used requires critical alignment. As a result, the integrated MOSFET-Schottky structure has many vertical and horizontal self-aligned features. In addition, the above-described process embodiments enable reduction of the channel length. Conventional processes utilize an implant and drive technique to form the body regions. This technique results in a tapered doping profile in the channel region requiring a longer channel length. In contrast, the above-described alternate techniques of selective epitaxial growth and two-pass angled implant for forming the body regions provide a uniform doping profile in the channel region, thus allowing a shorter channel length to be used. The on-resistance of the device is thus improved.

Moreover, use of a double epi structure provides design flexibility enabling optimization of the breakdown voltage and the on resistance while maintaining tight control over the MOSFET threshold voltage (Vth). Tight control over Vth is achieved by forming body regions 618 in N− epi 618 which compared to N+epi 602 exhibits a far more consistent and predictable doping concentration. Forming body regions in a background region with a predictable doping concentration allows tighter control over the threshold voltage. On the other hand, shielded electrodes 605 extending into N+epi 602 allows use of a higher doping concentration in N+epi 602 for the same breakdown voltage. A lower on-resistance is thus obtained for the same breakdown voltage and without adversely impacting control over the MOSFET threshold voltage.

Figure 7C:
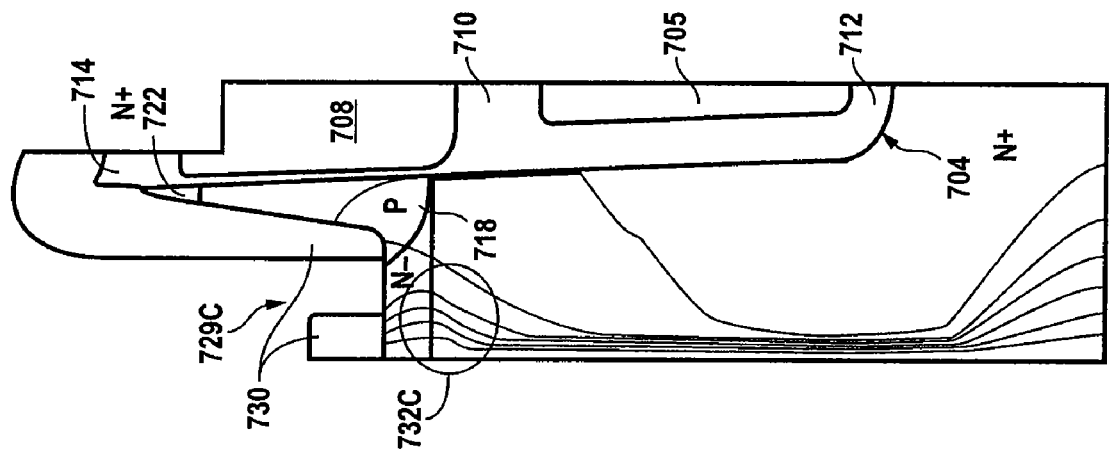
FIGS. 7A-7C show simulated avalanche current flow lines for three different dimple depths in a monolithically integrated trench MOSFET and Schottky diode structure.
Figure 7B:
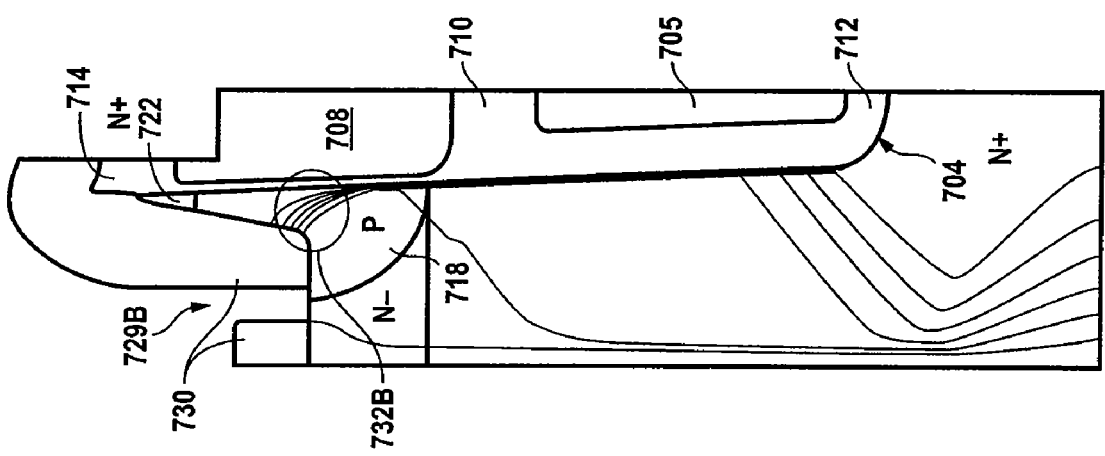
Figure 7A:
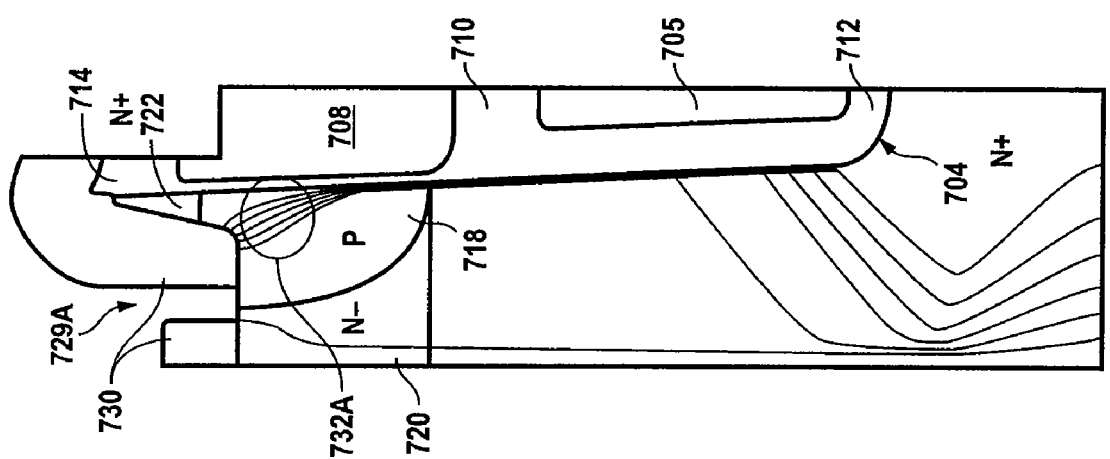

FIGS. 7A-7C show simulated avalanche current flow lines for three different dimple depths in an integrated trench MOSFET-Schottky diode structure. In the FIG. 7A structure, dimple 729A extends to a depth just below source region 722. In the FIG. 7B structure, dimple 729B extends deeper to about one half the height of body region 718. In the FIG. 7C structure, dimple 729C extends even deeper to just above the bottom of body region 718. In FIGS. 7A-7C, a gap appears in the top metal 730. This gap was included only for simulation purposes, and in practice, no such gap would be present in the top metal as is evident from the other figures in this disclosure.

As can be seen in FIG. 7A, avalanche current flow lines 732A are in close proximity to source region 722. However, as the dimple depth is increased in FIG. 7B and yet deeper in FIG. 7C, avalanche current flow lines 732B and 732C are shifted further away from source region 722 toward the Schottky region. The diversion of avalanche current away from the source region helps prevent the parasitic bipolar transistor from turning on, and thus improves the ruggedness of the device. In essence, the Schottky region acts like a heavy body region in collecting the avalanche current, thus eliminating the need for heavy body region for this purpose. Heavy body regions would still be required to obtain a good contact to the body region, but the frequency and size of the heavy body regions can be significantly reduced compared to conventional MOSFET structures. This frees up a large silicon area which is allocated to the Schottky diode. Thus, for the exemplary simulated structures in FIGS. 7A-7C, dimples which extend to a depth within the bottom half of body region 718 provide optimum results.

While the invention has been described using shielded gate trench MOSFET embodiments, implementation of the invention in other shielded gate MOSFET structures and trench gate MOSFETs with thick bottom dielectric as well as other types of power devices would be obvious to one skilled in this art in view of this disclosure. For example, the above-described techniques for integrating Schottky diode with MOSFET can be similarly implemented in the various power devices disclosed in the above-referenced U.S. patent application Ser. No. 11/026,276, filed Dec. 29, 2004, in particular in the trench gate, shielded gate, and charge balance devices shown, for example, in FIGS. 1, 2A, 3A, 3B, 4A, 4C, 5C, 9B, 9C, 10-12, and 24.

Although a number of specific embodiments are shown and described above, embodiments of the invention are not limited thereto. For example, while some embodiments of the invention are described using the open cell structure, implementing the invention using closed cell structures with various geometric shapes such as polygonal, circular, and rectangular, would be obvious to on skilled in this are in view of this disclosure. Further, while the embodiments of the invention are described using n-channel devices, the conductivity type of the silicon regions in these embodiments can be reversed to obtain p-channel devices. Therefore, the scope of the present invention should be determined not with reference to the above description but should, instead, be determined with reference to the appended claim, along with their full scope of equivalents.

What is claimed is:

1. A method of forming a monolithically integrated trench FET and Schottky diode, the method comprising:

forming a pair of trenches extending through an upper silicon layer and terminating within a lower silicon layer, the upper and lower silicon layers having a first conductivity type, the upper silicon layer extending over the lower silicon layer;

forming first and second silicon regions of a second conductivity type in the upper silicon layer between the pair of trenches;

forming a third silicon region of the first conductivity type extending into the first and second silicon regions between the pair of trenches such that remaining lower portions of the first and second silicon regions form two body regions separated by a portion of the upper silicon layer;

performing a silicon etch to form a contact opening extending through the third silicon region such that outer portions of the third silicon region remain, the outer portions of the third silicon region forming source regions; and forming an interconnect layer filling the contact opening so as to electrically contact the source regions and the portion of the upper silicon layer, the interconnect layer forming a Schottky contact with the portion of the upper silicon.

2. The method of claim 1 wherein the lower silicon layer has a higher doping concentration that the upper silicon layer.

3. The method of claim 1 wherein the electrical contact between the interconnect layer and the portion of the upper silicon layer is made at a depth below the source regions.

4. The method of claim 1 wherein the electrical contact between the interconnect layer and the portion of the upper silicon layer is made at a depth along a bottom half of the body regions.

5. The method of claim 1 wherein each of the first and second regions has a substantially uniform doping concentration.

6. The method of claim 1 wherein the lower silicon layer is epitaxially formed over a substrate of the first conductivity type, and the upper silicon layer is epitaxially formed over the lower silicon layer, wherein the substrate has a higher doping concentration than the lower silicon layer, and the lower silicon layer has a higher doping concentration than the upper silicon layer.

7. The method of claim 1 wherein the two body regions and the source regions are self-aligned to the pair of trenches.

8. The method of claim 1 further comprising
forming a heavy body region of the second conductivity type between the pair of trenches, the heavy body region extending into the two body regions and into the portion of the upper silicon layer, the heavy body region having a higher doping concentration than the two body regions.

9. The method of claim 8 wherein the two body regions, the source regions, and the heavy body region are self-aligned to the pair of trenches.

10. The method of claim 1 wherein the two body regions and the upper silicon layer have substantially the same depth.

11. The method of claim 1 further comprising:
forming a recessed gate electrode in each trench; and
forming a dielectric cap insulating each gate electrode from the interconnect layer.

12. The method of claim 11 further comprising:
before forming the recessed gate electrode, forming a shield electrode in a bottom portion of each trench.

13. The method of claim 11 further comprising:
before forming the recessed gate, forming a thick bottom dielectric extending along a bottom of each trench.

14. The method of claim 1 wherein the interconnect layer is a Schottky barrier metal layer.

15. A method of forming a monolithically integrated trench MOSFET and Schottky diode, the method comprising:
using a mask, forming a first plurality of trenches extending into and terminating in an upper silicon layer, the upper silicon layer extending over a lower silicon layer, the upper and lower silicon layers having a first conductivity type;
filling the first plurality of trenches with silicon material of a second conductivity type;
performing a thermal cycle to diffuse out the silicon material into the upper silicon layer and under the mask;
using the mask, forming a second plurality of trenches extending through the silicon material, the upper silicon layer, and terminating within the lower silicon layer such that the diffused out portions of the silicon material under the mask remain on each side of corresponding trenches;
forming a first silicon region of the first conductivity type extending into the diffused out portions such that remaining lower portions of the diffused out portions between every two adjacent trenches form two body regions separated by a portion of the upper silicon layer;
performing a silicon etch to form a contact opening extending through the first silicon region such that outer portions of the first silicon region remain, the outer portions of the first silicon region forming source regions; and
forming an interconnect layer filling the contact opening so as to electrically contact the source regions and the portion of the upper silicon layer, the interconnect layer forming a Schottky contact with the portion of the upper silicon.

16. A method of forming a monolithically integrated trench MOSFET and Schottky diode, the method comprising:
using a mask, forming a plurality of trenches extending through an upper silicon layer and terminating within a lower silicon layer, the upper and lower silicon layers having a first conductivity type, the upper silicon layer extending over the lower silicon layer;
performing a two-pass angled implant to form first silicon regions of a second conductivity type in the upper silicon layer along upper sidewalls of each trench;
forming a second silicon region of the first conductivity type extending into the first silicon regions between every two adjacent trench such that remaining lower portions of the first silicon regions form two body regions between every two adjacent trenches, the two body regions being separated by a portion of the upper silicon layer;
performing a silicon etch to form a contact opening extending through the second silicon region such that outer portions of the second silicon region remain between every two adjacent trenches, the outer portions of the second silicon region forming source regions; and
forming an interconnect layer filling the contact opening so as to electrically contact the source regions and the portion of the upper silicon layer, the interconnect layer forming a Schottky contact with the portion of the upper silicon.

17. The method of claim 16 wherein regions of the upper silicon layer which receive dopants during the two-pass angled implant are defined by the implant angle and a thickness of the mask.

18. A method of forming a monolithically integrated trench MOSFET and Schottky diode, the method comprising:
using a mask, forming a first plurality of trenches extending into and terminating at a first depth within an upper silicon layer, the upper silicon layer extending over a lower silicon layer, the upper and lower silicon layers having a first conductivity type;
performing a two-pass angled implant to form first silicon regions of a second conductivity type in the upper silicon layer along sidewalls of each trench;
using the mask, extending the plurality of trenches deeper to a second depth with the lower silicon layer;
forming a second silicon region of the first conductivity type extending into the first silicon regions between every two adjacent trench such that remaining lower portions of the first silicon regions form two body regions between every two adjacent trenches, the two body regions being separated by a portion of the upper silicon layer;

performing a silicon etch to form a contact opening extending through the second silicon region such that outer portions of the second silicon region remain between every two adjacent trenches, the outer portions of the second silicon region forming source regions; and forming an interconnect layer filling the contact opening so as to electrically contact the source regions and the portion of the upper silicon layer, the interconnect layer forming a Schottky contact with the portion of the upper silicon.

19. The method of claim 18 wherein regions of the upper silicon layer which receive dopants during the two-pass angled implant are defined by the first depth of the plurality of trenches, a thickness of the mask, and the implant angle.

* * * * *